United States Patent
Kim et al.

(10) Patent No.: US 9,929,013 B2
(45) Date of Patent: Mar. 27, 2018

(54) METHODS OF FABRICATING A SEMICONDUCTOR DEVICE

(71) Applicant: Samsung Electronics Co., Ltd., Suwon-si, Gyeonggi-do (KR)

(72) Inventors: Daeik Kim, Hwaseong-si (KR); Bong-Soo Kim, Yongin-si (KR); Jemin Park, Suwon-si (KR); Yoosang Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/402,545

(22) Filed: Jan. 10, 2017

(65) Prior Publication Data
US 2017/0200609 A1 Jul. 13, 2017

(30) Foreign Application Priority Data
Jan. 11, 2016 (KR) .................. 10-2016-0003326

(51) Int. Cl.
*H01L 21/033* (2006.01)
*H01L 21/027* (2006.01)

(52) U.S. Cl.
CPC ...... *H01L 21/0338* (2013.01); *H01L 21/0273* (2013.01); *H01L 21/0335* (2013.01); *H01L 21/0337* (2013.01)

(58) Field of Classification Search
CPC ............. H01L 21/0338; H01L 21/0273; H01L 21/0335; H01L 21/0337
See application file for complete search history.

(56) References Cited

U.S. PATENT DOCUMENTS

| | | | |
|---|---|---|---|
| 8,178,442 B2* | 5/2012 | Park | ............... H01L 21/3086 216/46 |
| 8,278,178 B2 | 10/2012 | Lee et al. | |
| 8,502,322 B2 | 8/2013 | Nitta | |
| 9,236,501 B2 | 1/2016 | Lim | |
| 9,281,362 B2 | 3/2016 | Lee et al. | |
| 9,330,913 B2 | 5/2016 | You et al. | |
| 2008/0048333 A1* | 2/2008 | Seo | ............... H01L 21/743 257/773 |
| 2008/0280442 A1 | 11/2008 | Kwak et al. | |
| 2010/0167539 A1* | 7/2010 | Eun | ............... H01L 21/76801 438/675 |
| 2012/0171865 A1 | 7/2012 | Yoo | |
| 2015/0041986 A1 | 2/2015 | Yanagidaira et al. | |
| 2016/0196982 A1* | 7/2016 | Kang | ............... H01L 21/02595 438/702 |

FOREIGN PATENT DOCUMENTS

JP 2012009869 1/2012
KR 20150035316 4/2015

* cited by examiner

*Primary Examiner* — Duy Vu N Deo
(74) *Attorney, Agent, or Firm* — Myers Bigel, P.A.

(57) ABSTRACT

Methods of fabricating a semiconductor device are provided. The methods may include etching a bulk pattern on a peripheral region to form patterns and then forming a layer on both a cell region and a peripheral region. The methods may include forming line patterns that extend from the cell region onto the peripheral region and then forming a layer on both the cell region and a peripheral region.

20 Claims, 16 Drawing Sheets

METHODS OF FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2016-0003326, filed on Jan. 11, 2016, in the Korean Intellectual Property Office, the disclosure of which is hereby incorporated by reference in its entirety.

BACKGROUND

The present disclosure generally relates to methods of fabricating a semiconductor device, and more particularly, to methods of fabricating a semiconductor device including line-shaped structures.

Due to small sizes, capability of performing multi-functions, and/or low manufacturing cost, semiconductor devices have been widely used as important elements in the electronics industry. However, with advances in the electronics industry, semiconductor devices are becoming more and more highly integrated, and many technical issues may arise. For example, as an integration density of semiconductor devices increases, it may become difficult to form fine elements in the semiconductor devices.

SUMMARY

Some embodiments of the inventive concepts provide a method of fabricating a highly-reliable and highly-integrated semiconductor device.

According to some embodiments of the inventive concepts, a method of fabricating a semiconductor device may include forming an etch target layer on a substrate that includes a cell region and a peripheral region and forming first patterns and a bulk pattern on the etch target layer. The first patterns may be formed on the cell region and may have a first width, and the bulk pattern may be formed on the peripheral region. The method may also include conformally forming a spacer layer on the first patterns and the bulk pattern and forming first mask patterns to cover the spacer layer on the cell region and to expose the spacer layer on the peripheral region, etching the spacer layer and the bulk pattern on the peripheral region, using the first mask patterns as an etch mask, to form second patterns on the peripheral region, forming a first layer on the first and second patterns, etching the first layer and the spacer layer until top surfaces of the first and second patterns are exposed to form third patterns and spacers on the cell region, and anisotropically etching the spacers to form openings exposing side surfaces of the first and third patterns.

According to some embodiments of the inventive concepts, a method of fabricating a semiconductor device may include forming an etch target layer on a substrate that includes a cell region and a peripheral region and forming first patterns on the cell region. Each of the first patterns may have a first width and may include a portion extended onto at least a portion of the peripheral region. The method may also include conformally forming a spacer layer having a first thickness on the first patterns, forming a first mask pattern to cover the cell region and to expose the peripheral region, etching the spacer layer on the peripheral region, using the first mask pattern as an etch mask, to form a peripheral spacer layer having a second thickness less than the first thickness, forming a first layer on the spacer layer that is on the cell region and the peripheral spacer layer, polishing the first layer, the spacer layer on the cell region, and the peripheral spacer layer to expose the first patterns and to form cell spacers, peripheral spacers, and second patterns, and anisotropically etching the cell spacers and the peripheral spacers.

According to some embodiments of the inventive concepts, a method of forming a semiconductor device may include forming an underlying layer on a substrate, forming a plurality of first masks and a plurality of second masks on the underlying layer, and forming a spacer layer along surfaces of the plurality of first masks. The spacer layer may define a plurality of recesses between respective ones of the plurality of first masks. The method may also include forming a first mask layer on the plurality of first masks and the plurality of second masks. The first mask layer may be formed in the plurality of recesses and may be formed in spaces between respective ones of the plurality of second masks, and the first mask layer may contact sides of the plurality of second masks. The method may further include forming a plurality of third masks in respective ones of the plurality of recesses, a plurality of fourth masks in respective ones of the spaces, and a plurality of spacers by etching the first mask layer and the spacer layer until upper surfaces of the plurality of first masks and upper surfaces of the plurality of second masks are exposed, etching the plurality of spacers until the underlying layer is exposed and etching the underlying layer, after etching the plurality of spacers, using the plurality of first masks, the plurality of second masks, the plurality of third masks and the plurality of fourth masks as an etch mask

BRIEF DESCRIPTION OF THE DRAWINGS

Example embodiments will be more clearly understood from the following description taken in conjunction with the accompanying drawings. The accompanying drawings represent non-limiting, example embodiments.

It should be noted that these drawings are intended to illustrate the general characteristics of methods, structure and/or materials utilized in example embodiments and to supplement the written description provided below. These drawings are not, however, to scale and may not precisely reflect the precise structural or performance characteristics of any given embodiment and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

FIGS. 1 to 9 are cross-sectional views illustrating a method of fabricating a semiconductor device, according to some embodiments of the inventive concepts.

Figure 1:
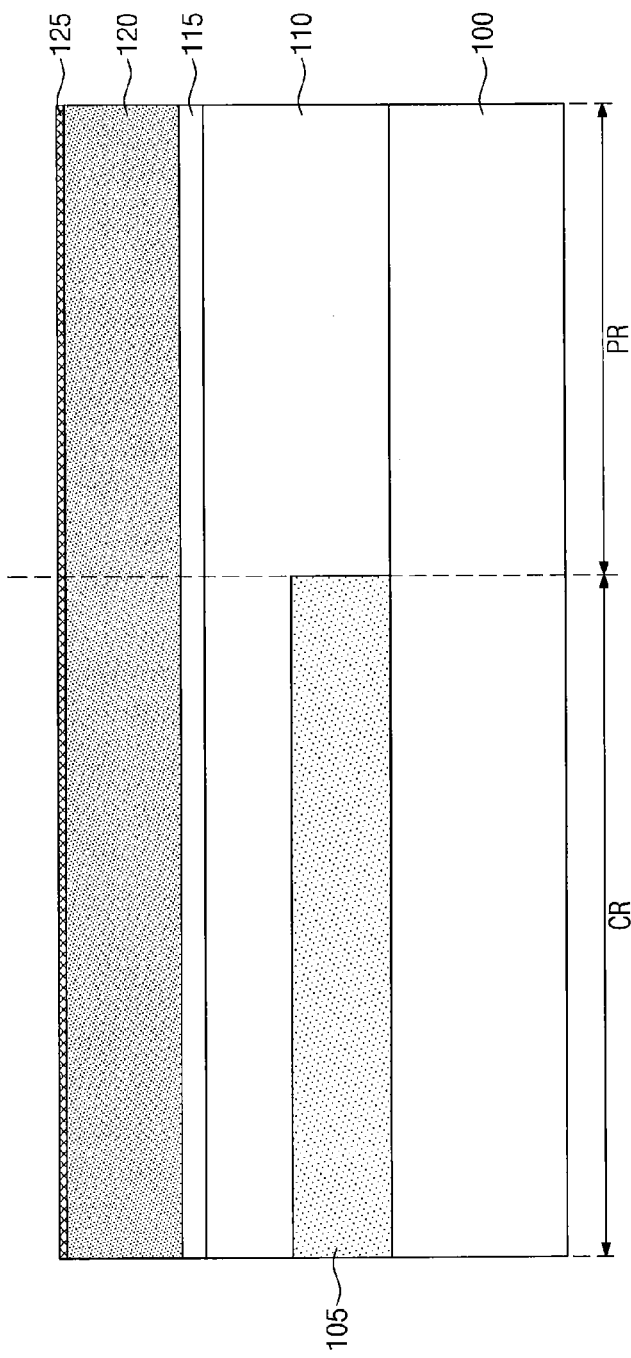
FIGS. 1 to 9 are cross-sectional views illustrating a method of fabricating a semiconductor device, according to some embodiments of the inventive concepts.

Referring to FIG. 1, an etch target layer 105 may be formed on a substrate 100. The substrate 100 may include a cell region CR, on which memory cells are provided, and a peripheral region PR, on which logic circuits are provided.

A first layer 110, an etch stop layer 115, a second layer 120, and a polishing stop layer 125 may be sequentially formed on the etch target layer 105. The first layer 110 and the second layer 120 may be formed of or include the same material. For example, the first layer 110 and the second layer 120 may include a spin on hardmask (SOH) material. Each of the etch stop layer 115 and the polishing stop layer 125 may include a material having an etch selectivity with respect to the first layer 110 and the second layer 120. Each of the etch stop layer 115 and the polishing stop layer 125 may include a material having an etch rate that is different from etch rates of the first layer 110 and the second layer 120 under a process condition. For example, the etch stop layer 115 and the polishing stop layer 125 may be formed of or include silicon oxynitride. In some embodiments, the formation of the first layer 110 may be omitted. It will be understood that the etch target layer 105, the first layer 110 and the etch stop layer 115 may be referred to as an underlying layer.

Figure 2:
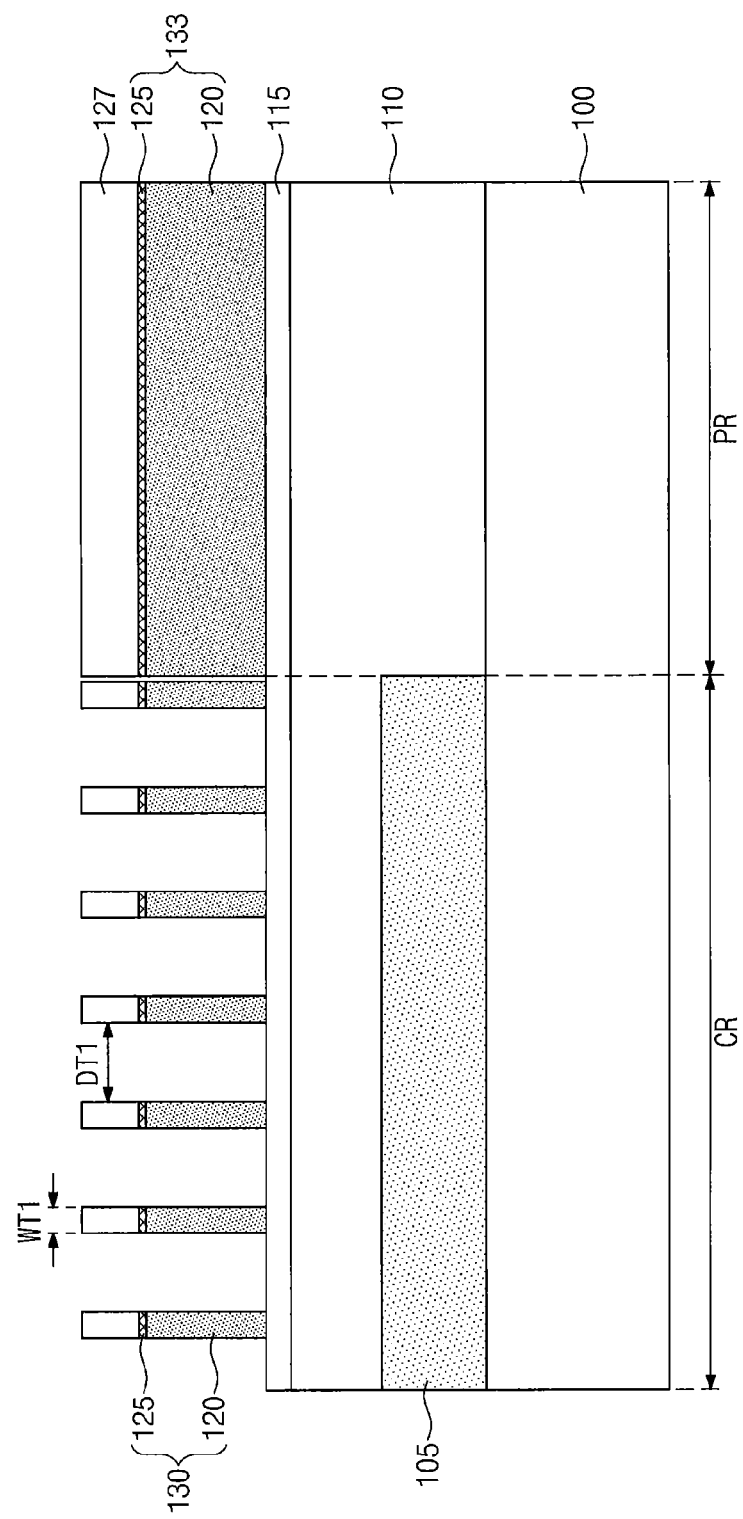

Referring to FIG. 2, first mask patterns 127 may be formed on the polishing stop layer 125, and the polishing stop layer 125 and the second layer 120 may be sequentially etched using the first mask patterns 127 as an etch mask. Ones of the first mask patterns 127 may be formed on the cell region CR, and each of the first mask patterns 127 formed on the cell region CR may have a line-shaped structure having a first width WT1 and may extend in a specific direction. Two adjacent ones of the first mask patterns 127 may be spaced apart from each other by a first distance DT1, and here, the first distance DT1 may be about three times the first width WT1. One of the first mask patterns 127 may be formed on the peripheral region PR to cover the polishing stop layer 125.

As a result of the etching process, first patterns 130 may be formed on the cell region CR. Each of the first patterns 130 may have a structure, in which a portion of the second layer 120 and a portion of the etch stop layer 115 are sequentially stacked. Each of the first patterns 130 may have the first width WT1, and two adjacent ones of the first patterns 130 may be spaced apart from each other by the first distance DT1. On the peripheral region PR, the second layer 120 and the etch stop layer 115 may constitute a bulk pattern 133, which is not etched when the etching process is performed to form the first patterns 130. It will be understood that the bulk pattern 133 may be referred to as a preliminary pattern since the bulk pattern 133 is etched by subsequent processes.

After the etching process, the first mask patterns 127 may be removed.

Figure 3:
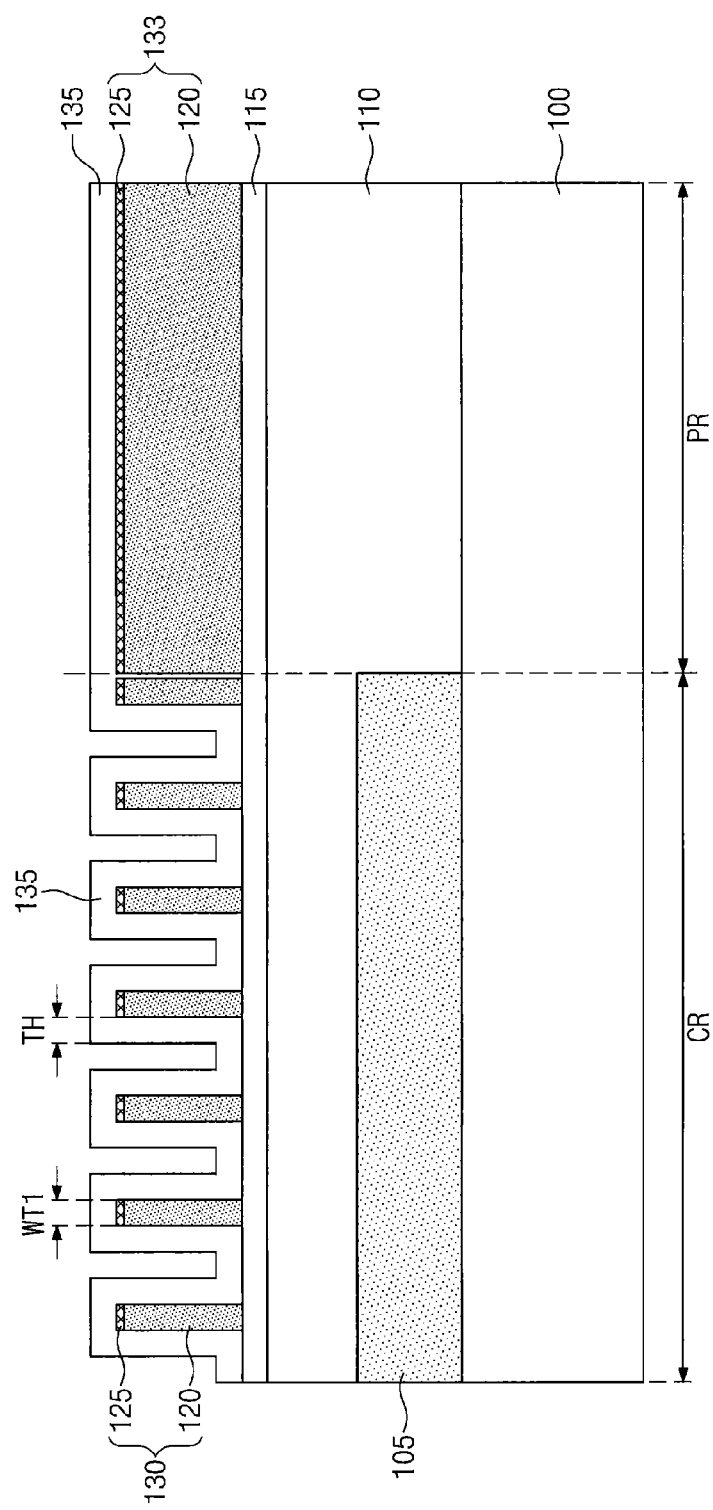

Referring to FIG. 3, a spacer layer 135 may be conformally formed on the cell region CR and the peripheral region PR of the substrate 100. The spacer layer 135 may be too thin to completely fill gap regions between the first patterns 130 on the cell region CR. In some embodiments, the spacer layer 135 may be formed along surfaces of the first patterns 130 and may have a substantially uniform thickness as illustrated in FIG. 3.

The spacer layer 135, along with the first patterns 130, may be used to form a fine line-and-space structure through a double patterning technology (DPT). In some embodiments, the spacer layer 135 may be formed to have a width TH that is substantially equal to the first width WT1 as illustrated in FIG. 3.

The spacer layer 135 may include a material having an etch selectivity with respect to the first patterns 130 and the etch stop layer 115. The spacer layer 135 may include a material having an etch rate different from etch rates of the first patterns 130 and the etch stop layer 115 under a process condition. For example, the spacer layer 135 may be formed of or include silicon oxide.

Figure 4:
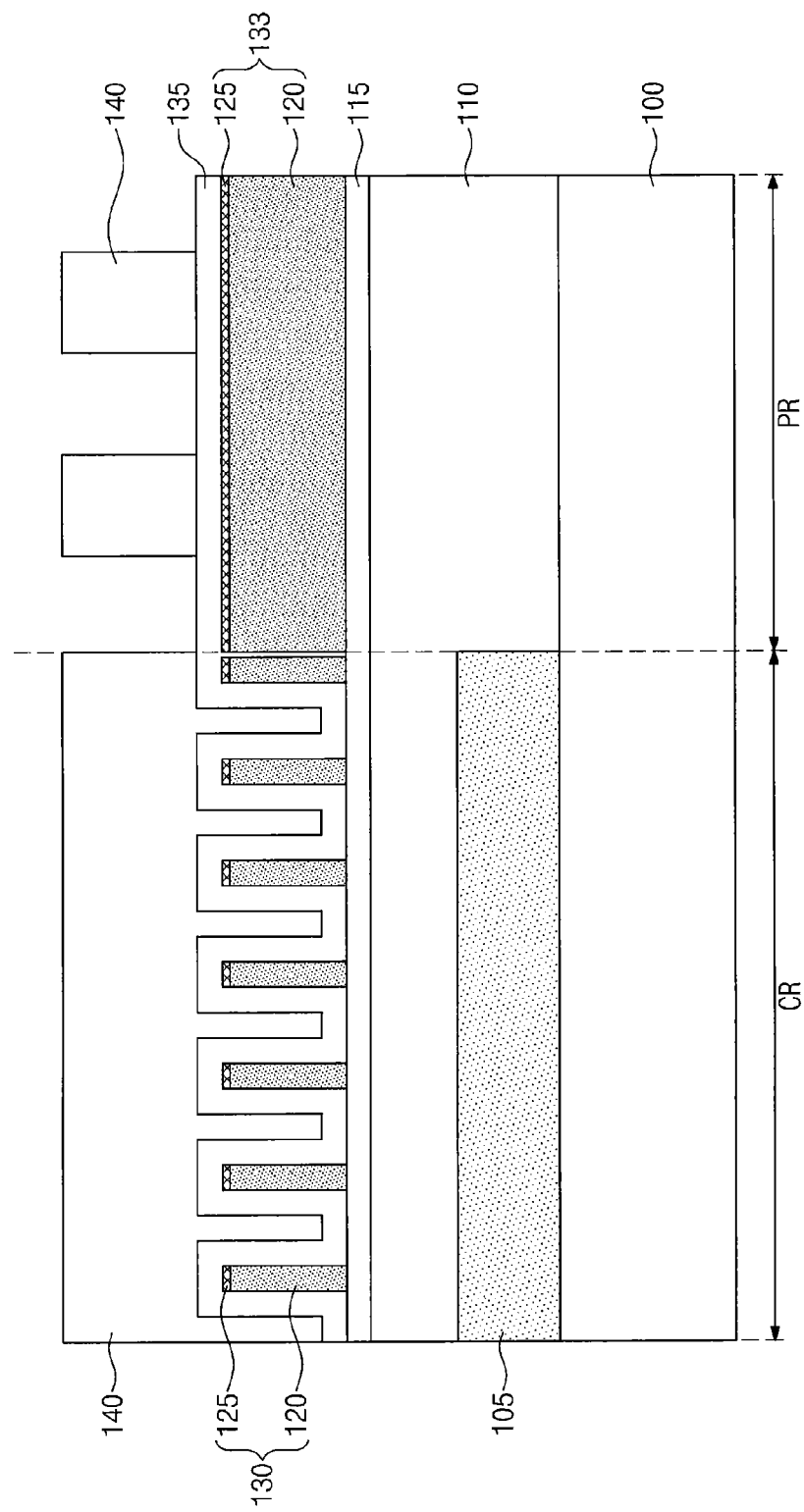

Referring to FIG. 4, second mask patterns 140 may be formed to completely cover the cell region CR and to partially expose the spacer layer 135 on the peripheral region PR. In some embodiments, the second mask patterns 140 may include a material that can be etched at substantially the same etch rate as the second layer 120 under a process condition. For example, the second mask patterns 140 may include substantially the same material as the second layer 120. For example, the second mask patterns 140 may be formed of or include an SOH or photoresist material.

Figure 5:
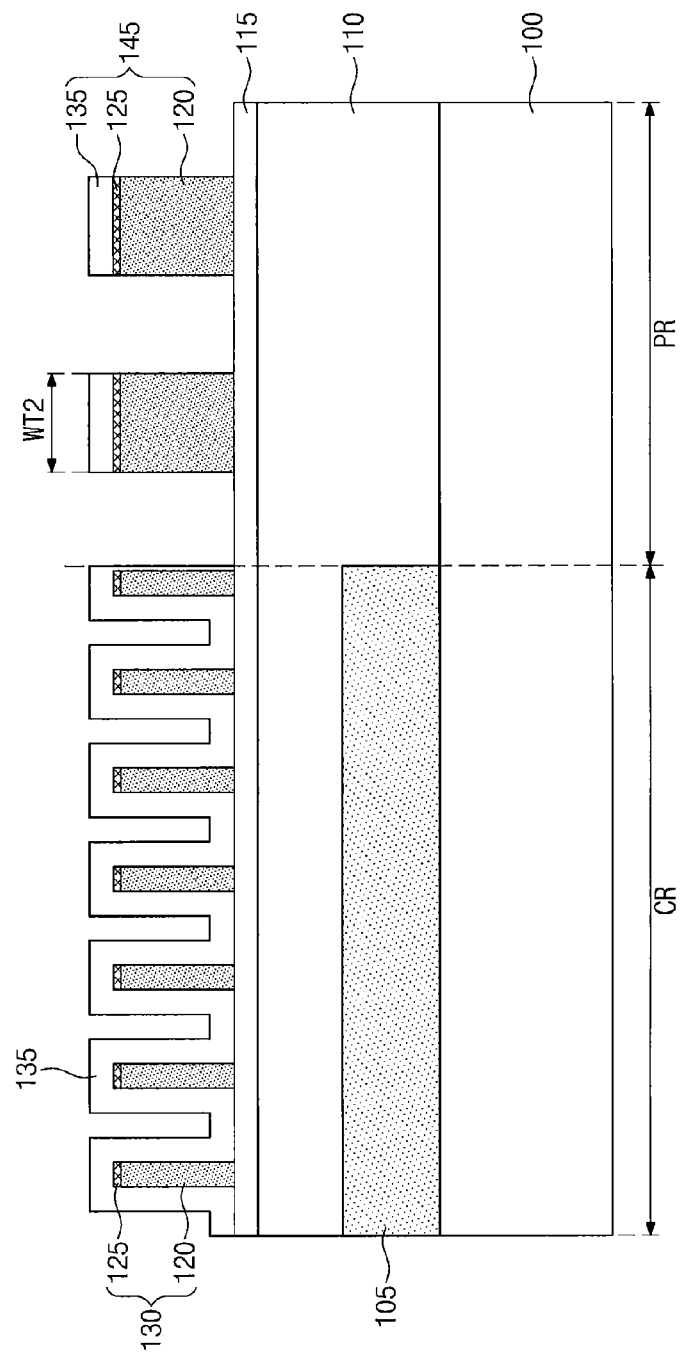

Referring to FIG. 5, the spacer layer 135 and the bulk pattern 133 exposed by ones of the second mask patterns 140 on the peripheral region PR may be etched using the ones of the second mask patterns 140 as an etch mask to form second patterns 145. Each of the second patterns 145 may have a structure, in which a portion of the second layer 120, a portion of the polishing stop layer 125, and a portion of the spacer layer 135 are sequentially stacked. Each of the second patterns 145 may have a second width WT2 that is greater than the first width WT1. A distance between the second patterns 145 may be greater than the first width WT1. The spacer layer 135 may define recesses between two adjacent ones of the first patterns 130 as illustrated in FIG. 5.

In some embodiments, the second mask patterns 140 may be substantially the same as the second layer 120 of the bulk pattern 133 in terms of their materials or etch rates. Therefore, the second mask patterns 140 may be removed during etching the second layer 120 of the bulk pattern 133. Accordingly, it may be unnecessary to perform an additional process to remove the second mask patterns 140. In some embodiments, the second mask patterns 140 may remain after etching the second layer 120 of the bulk pattern 133, and a process removing the second mask patterns 140 may be performed.

Figure 6:
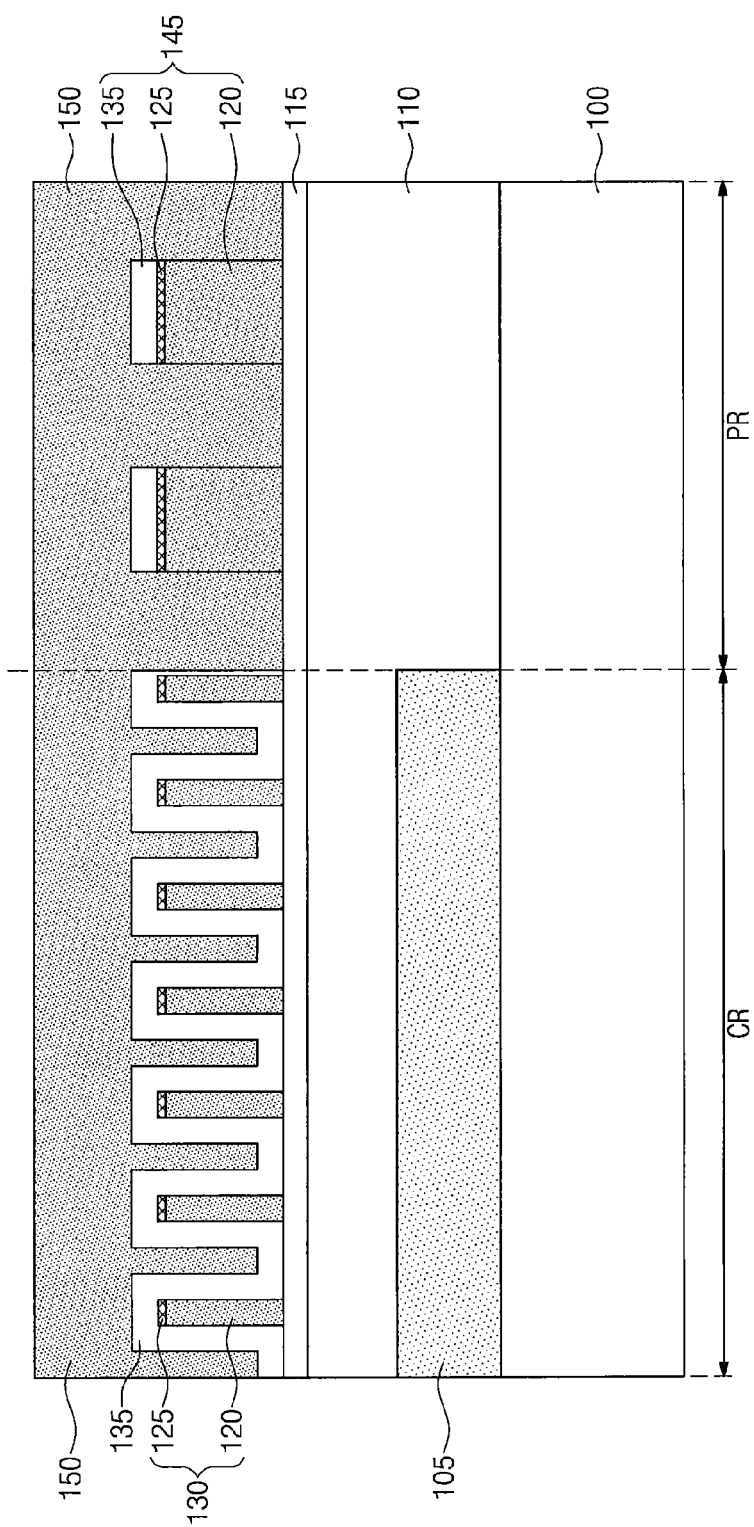

Referring to FIG. 6, a third layer 150 may be formed to cover the first patterns 130 and the spacer layer 135 on the cell region CR and the second patterns 145 on the peripheral region PR. In some embodiments, the third layer 150 may be formed to completely cover the cell region CR and the peripheral region PR. In some embodiments, the third layer 150 may be formed in the recesses defined by the spacer layer 135 and in spaces between two adjacent ones of the second patterns 145 as illustrated in FIG. 6. The third layer 150 may contact sides of the second patterns 145.

In some embodiments, the third layer 150 may be formed of or include substantially the same material as the second layers 120 of the first and second patterns 130 and 145. For example, the third layer 150 may be formed of or include an SOH material.

Figure 7:
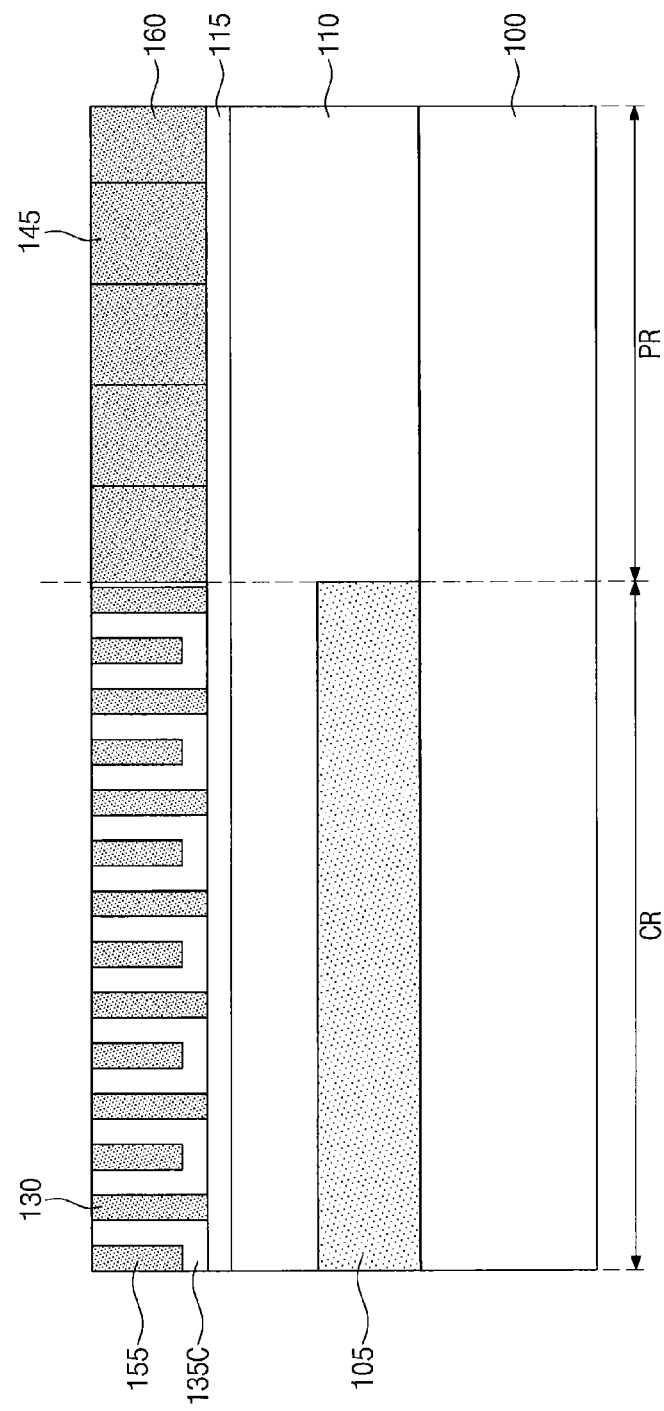

Referring to FIG. 7, the third layer 150 and the spacer layer 135 may be removed to expose top surfaces of the first and second patterns 130 and 145. In some embodiments, the third layer 150 and the spacer layer 135 may be removed by polishing the third layer 150 and the spacer layer 135. The polishing of the third layer 150 and the spacer layer 135 may be performed using an etch-back process. Here, the polishing stop layer 125 of each of the first and second patterns 130 and 145 may prevent the polishing process from being excessively performed.

As a result of the polishing process, cell spacers 135C and third patterns 155 may be formed on the cell region CR, and fourth patterns 160 may be formed on the peripheral region PR. The cell spacers 135C may be formed to have a "U"-shaped cross-section between the first patterns 130, the third patterns 155 may be formed to fill inner spaces of the cell spacers 135C, respectively, and the fourth patterns 160 may be formed to fill gap regions between the second patterns 145. The second patterns 145 and the fourth patterns 160 may be formed of or include substantially the same material.

As appreciated by the inventors, if etching the bulk pattern 133 on the peripheral region PR to form the second patterns 145, which is illustrated in FIGS. 4 and 5, is omitted, there may be a difference in thicknesses between portions of the third layer 150 that are respectively formed on the cell region CR and the peripheral region PR or uppermost surfaces of the portions of the third layer 150 that are respectively formed on the cell region CR and the peripheral region PR may be at different levels. For example, a thickness of the third layer 150 on the cell region CR may be less than that of the third layer 150 on the peripheral region PR because, in the peripheral region PR, the third layer 150 is formed to merely cover the bulk pattern 133, whereas in the cell region CR including the first patterns 130, the third layer 150 is formed not only to fill gap regions between the first patterns 130 but also to cover the first patterns 130. If a polishing process is performed on this structure, the difference in the thicknesses or the levels of the uppermost surfaces of the third layer 150 between the cell region CR and the peripheral region PR may lead to a difficulty in the polishing process. According to some embodiments of the inventive concepts, since the bulk pattern 133 is etched to form the second patterns 145, the third layer 150 may have the same thickness on the cell and peripheral regions CR and PR, and thus it may be possible to easily perform the polishing process.

Thereafter, the polishing stop layer 125 may be removed. Accordingly, each of the first and second patterns 130 and 145 may be formed.

Figure 8:
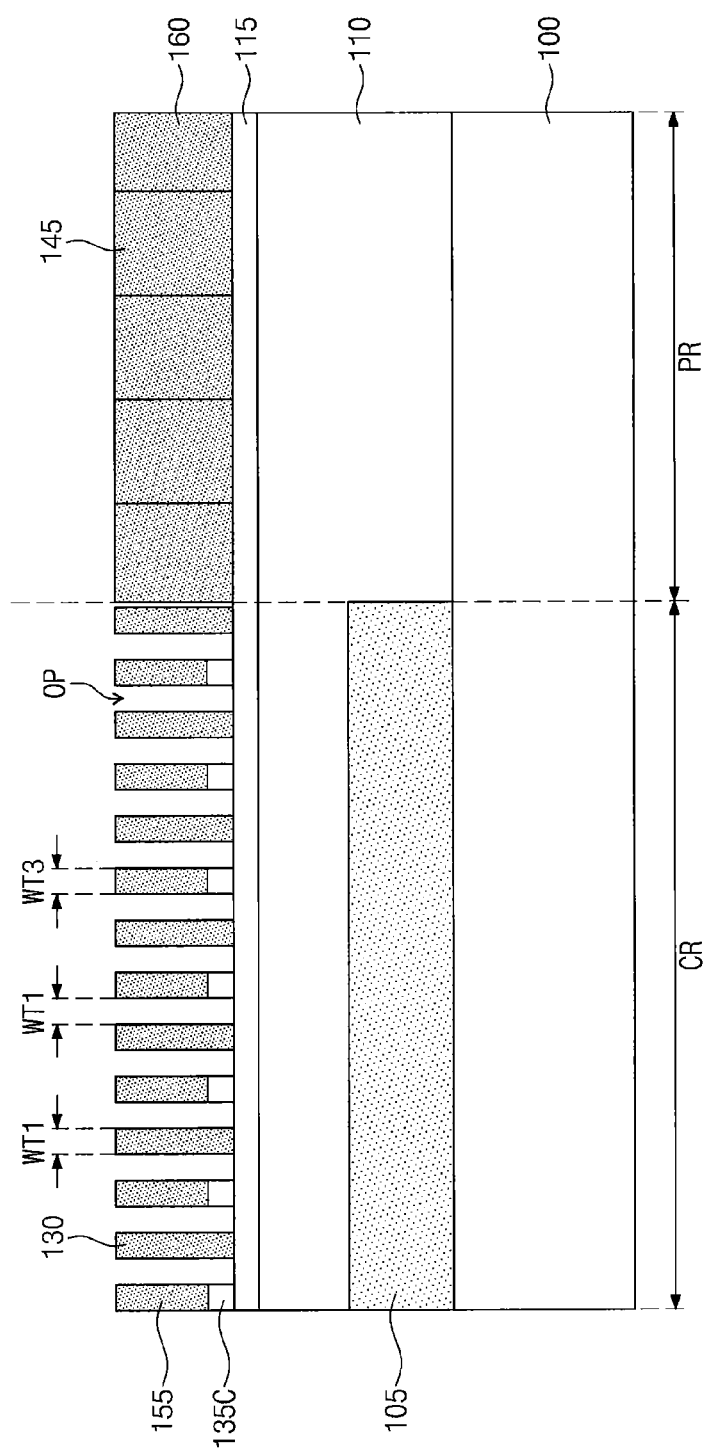

Referring to FIG. 8, the cell spacers 135C may be removed (e.g., anisotropically etched) to form openings OP exposing side surfaces of the first and third patterns 130 and 155 and partially exposing the top surface of the etch stop layer 115. The etch stop layer 115 may prevent the anisotropic etching process on the cell spacers 135C from proceeding further.

As a result of the etching process, portions of the cell spacers 135C may remain below the third patterns 155, respectively. Each of the third patterns 155 may have a third width WT3, which may be substantially the same as the first width WT1. Also, a width of each of the openings OP may be substantially the same as the first width WT1. In some embodiments, a portion of the etch stop layer 115 that is formed on the peripheral region PR may be entirely covered by the second patterns 145 and the fourth patterns 160 as illustrated in FIG. 8.

Figure 9:
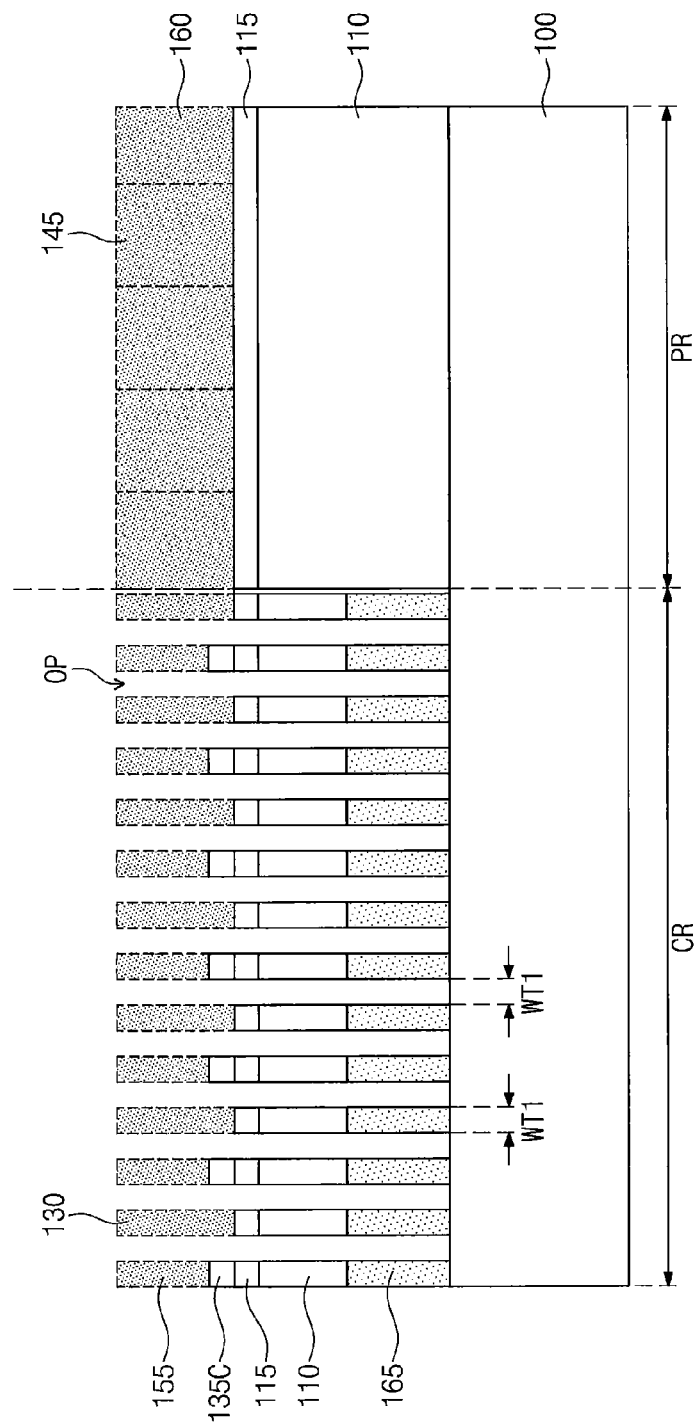

Referring to FIG. 9, the etch stop layer 115, the first layer 110, and the etch target layer 105 may be etched using the first and third patterns 130 and 155 as an etch mask to form target patterns 165 having the first width WT1. The target patterns 165 may be formed on the cell region CR to have a line-and-space structure. In some embodiments, two adjacent ones of the target patterns 165 may be formed to be spaced apart from each other by a distance that is substantially equal to the first width WT1.

Hereinafter, a method of fabricating a semiconductor device will be described with reference to FIGS. 10 to 16.

Figure 10:
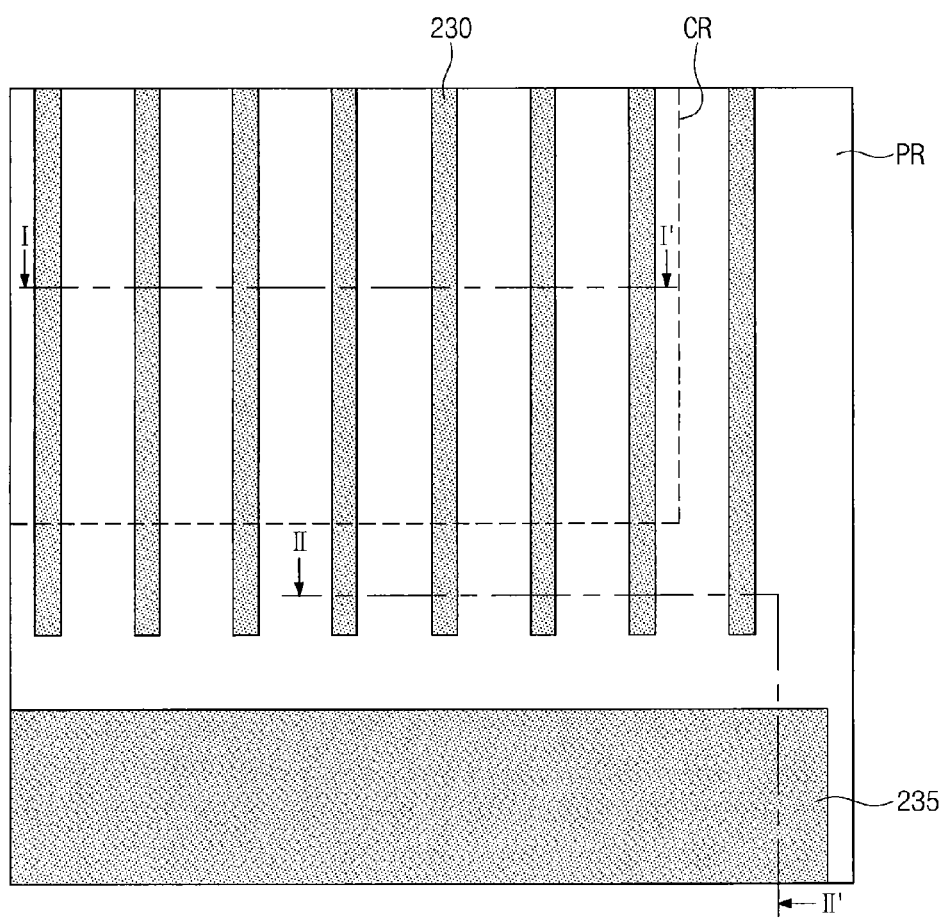
FIG. 10 is a plan view illustrating a semiconductor device according to some embodiments of the inventive concepts.

FIGS. 11 to 16 are cross-sectional views illustrating a method of fabricating a semiconductor device, according to some embodiments of the inventive concepts. FIG. 10 is a plan view of a semiconductor device, which will be fabricated by the method illustrated in FIGS. 11 to 16. Here, each of the cross-sectional views in FIGS. 11 to 16 illustrates cross-sections taken along the lines I-I' and II-II' of FIG. 10.

Figure 11:
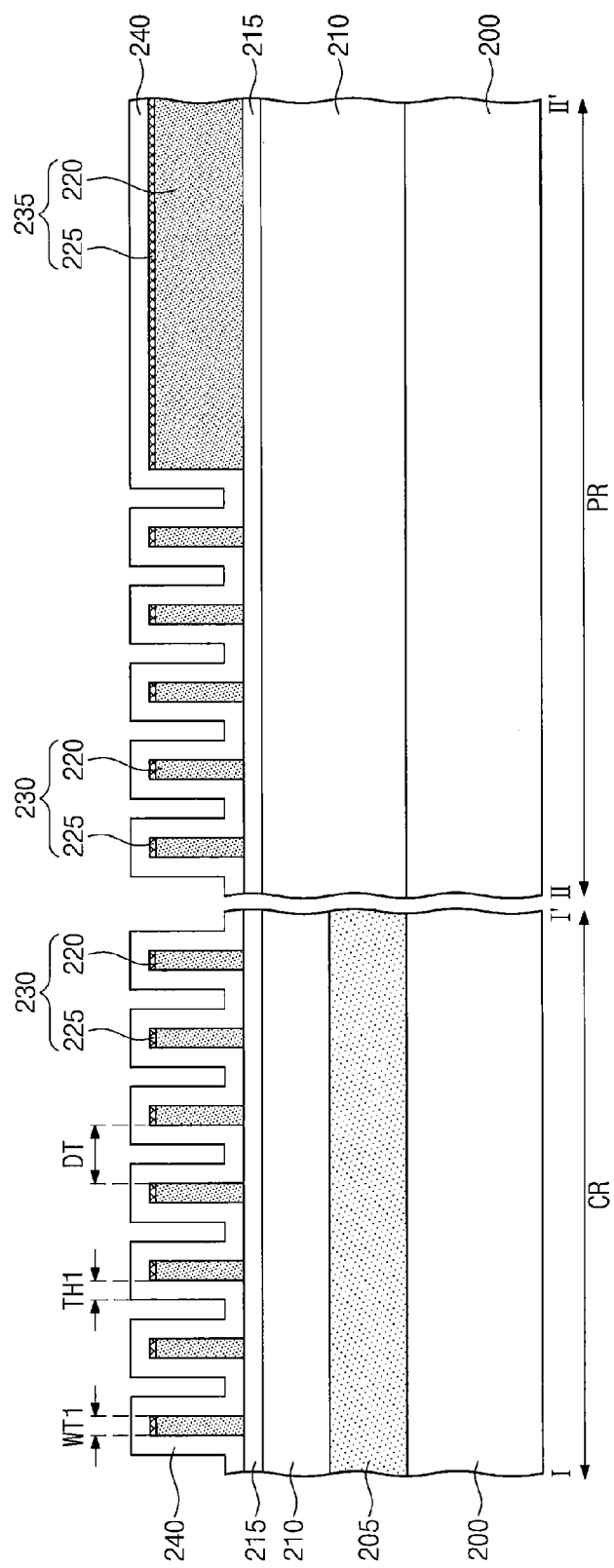
FIGS. 11 to 16 are cross-sectional views illustrating a method of fabricating a semiconductor device, according to some embodiments of the inventive concepts.

Referring to FIGS. 10 and 11, an etch target layer 205 may be formed on a substrate 200. The substrate 200 may include a cell region CR, on which memory cells are provided, and a peripheral region PR, on which logic circuits are provided.

A first layer 210, an etch stop layer 215, a second layer 220, and a polishing stop layer 225 may be sequentially formed on the etch target layer 205. The first layer 210 and the second layer 220 may be formed of or include the same material. For example, the first layer 210 and the second layer 220 may be formed of or include an SOH material. Each of the etch stop layer 215 and the polishing stop layer 225 may include a material having an etch selectivity with respect to the first layer 210 and the second layer 220. Each of the etch stop layer 215 and the polishing stop layer 225 may include a material having an etch rate different from etch rates of the first layer 210 and the second layer 220 under a process condition. For example, the etch stop layer 215 and the polishing stop layer 225 may include silicon oxynitride. In some embodiments, the formation of the first layer 210 may be omitted.

First mask patterns (not shown) may be formed on the polishing stop layer 225, and the polishing stop layer 225 and the second layer 220 may be sequentially etched using the first mask patterns as an etch mask. Each of the first mask patterns may be formed have a line-shaped structure crossing the cell region CR and extending from the cell region CR to the peripheral region PR. The first mask patterns may be spaced apart from each other by a distance that is about three times the first width WT1, and each of the first mask patterns may have a first width WT1. The first mask patterns may be formed to cover a portion of the polishing stop layer 225 formed on the peripheral region PR. A portion of the peripheral region PR may be covered with the first mask patterns and a portion of the peripheral region PR near the cell region CR may be exposed by the first mask patterns.

As a result of the etching process, first patterns 230 may be formed on the cell region CR. Each of the first patterns 230 may be extended from the cell region CR onto at least a portion of the peripheral region PR. Each of the first patterns 230 may have a structure, in which a portion of the second layer 220 and a portion of the etch stop layer 215 are sequentially stacked. Each of the first patterns 230 may have the first width WT1, and two adjacent ones of the first patterns 230 may be spaced apart from each other by a distance DT, which may be about three times the first width WT1 as illustrated in FIG. 11. On the peripheral region PR other than the exposed region near the first patterns 230, the second layer 220 and the etch stop layer 215 may constitute a bulk pattern 235, which is not etched by the etching process.

A spacer layer 240 may be formed to conformally cover the cell region CR and the peripheral region PR of the substrate 200. The spacer layer 240 may be too thin to fill gap regions between the first patterns 230 of the cell region CR. For example, the spacer layer 240 may be formed to have a first thickness TH1 that is substantially the same as the first width WT1. The spacer layer 240 may include a material having an etch selectivity with respect to the first patterns 230 and the etch stop layer 215. The spacer layer 240 may include a material having an etch rate different from etch rates of the first patterns 230 and the etch stop layer 215 under a process condition. The spacer layer 240 may be formed of or include, for example, silicon oxide.

Figure 12:
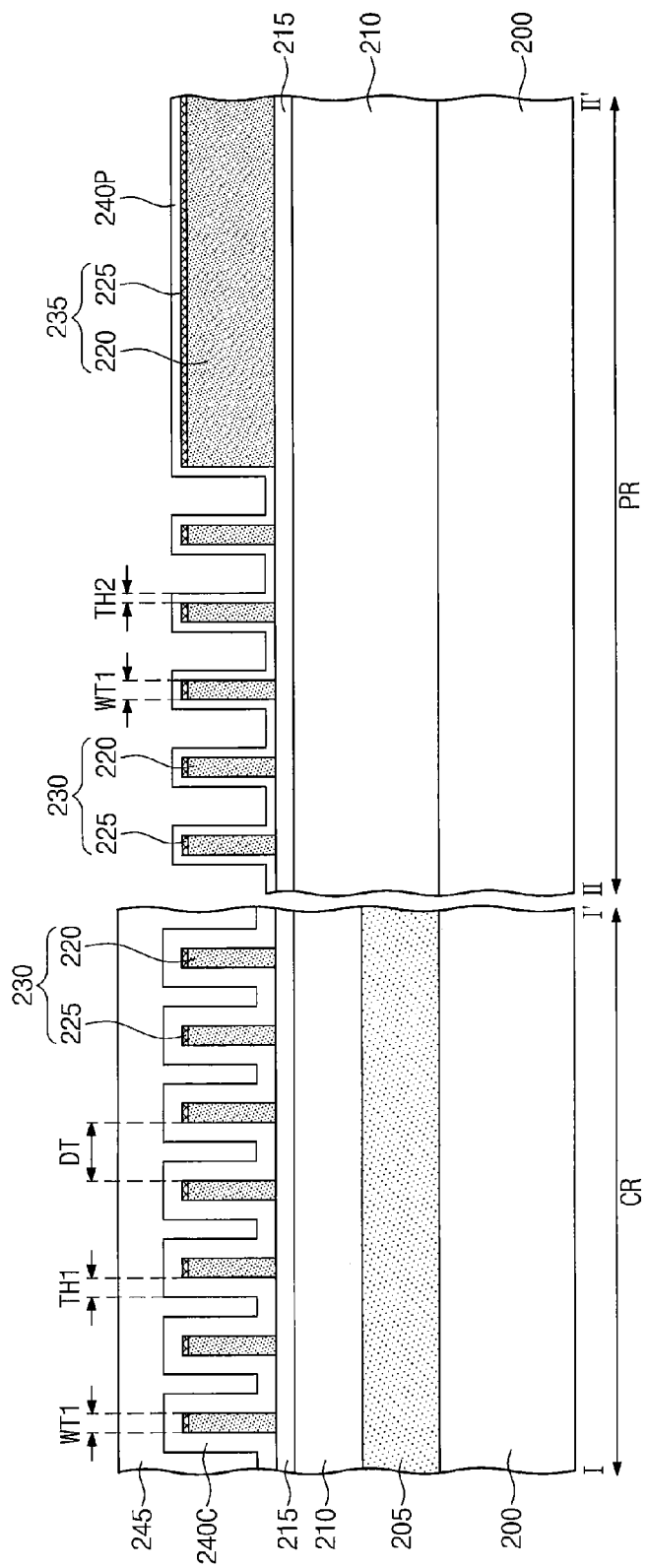

Referring to FIG. 12, a second mask pattern 245 may be formed to cover the cell region CR and to expose the peripheral region PR. The second mask pattern 245 may include a material having an etch selectivity with respect to the spacer layer 240. The second mask pattern 245 may include a material having an etch rate different from an etch rate of the spacer layer 240 under a process condition. The second mask pattern 245 may be formed of or include a photoresist or SOH material.

In some embodiments, the second mask pattern 245 may be formed to expose portions of the first patterns 230 extended on the peripheral region PR and to expose the bulk pattern 235 on the peripheral region PR. The spacer layer 240 on the peripheral region PR may be partially etched using the second mask pattern 245 as an etch mask. The etching process may be performed in a wet-etching manner. As a result of the etching process, the spacer layer 240 on the cell region CR may have the first thickness TH1, and the spacer layer 240 on the peripheral region PR may have a second thickness TH2 that is less than the first thickness TH1. For the sake of brevity, the spacer layer 240 formed on the cell region CR will be referred to as "a cell spacer layer 240C" and the spacer layer 240 formed on the peripheral region PR will be referred to as "a peripheral spacer layer 240P" The cell spacer layer 240C may have the first thickness TH1, and the peripheral spacer layer 240P may have the second thickness TH2.

After the etching process, the second mask pattern 245 may be removed. In some embodiments, the second mask pattern 245 may be removed by an ashing process and/or a strip process.

Figure 13:
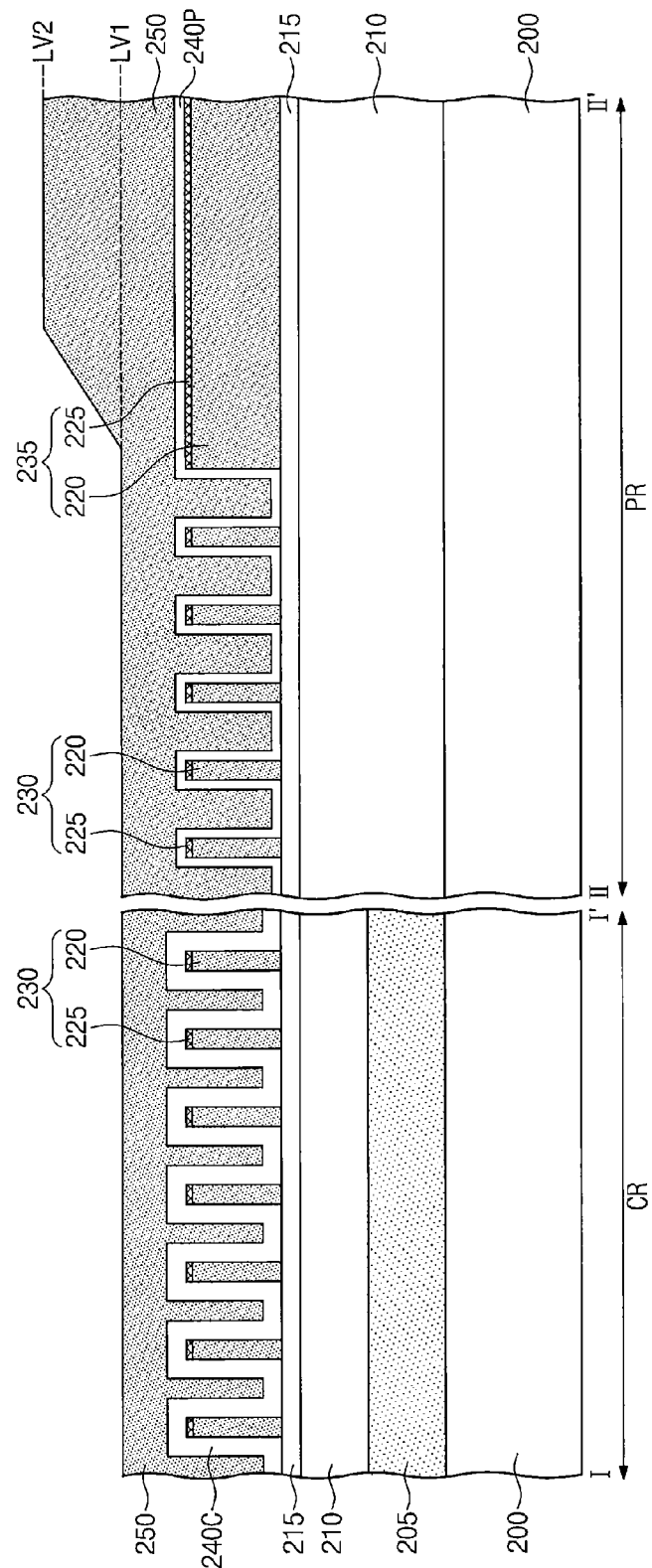

Referring to FIG. 13, a third layer 250 may be formed on the cell spacer layer 240C and the peripheral spacer layer 240P. The third layer 250 may be formed of or include substantially the same material as the second layer 220. For example, the third layer 250 may be formed of or include an SOH material.

On the cell region CR, the third layer 250 may be formed not only to fill the gap regions between the first patterns 230 but also to cover the first patterns 230, and thus, the third layer 250 on the cell region CR may have a top surface positioned at a first level LV1. Similarly, on or near a portion of the peripheral region PR including the first patterns 230, the third layer 250 may be formed to have a top surface positioned at the first level LV1. However, on the remaining regions of the peripheral region PR, a top surface of the third layer 250 may be positioned at a second level LV2 that is higher than the first level LV1, because the third layer 250 is formed on the bulk pattern 235.

Figure 14:
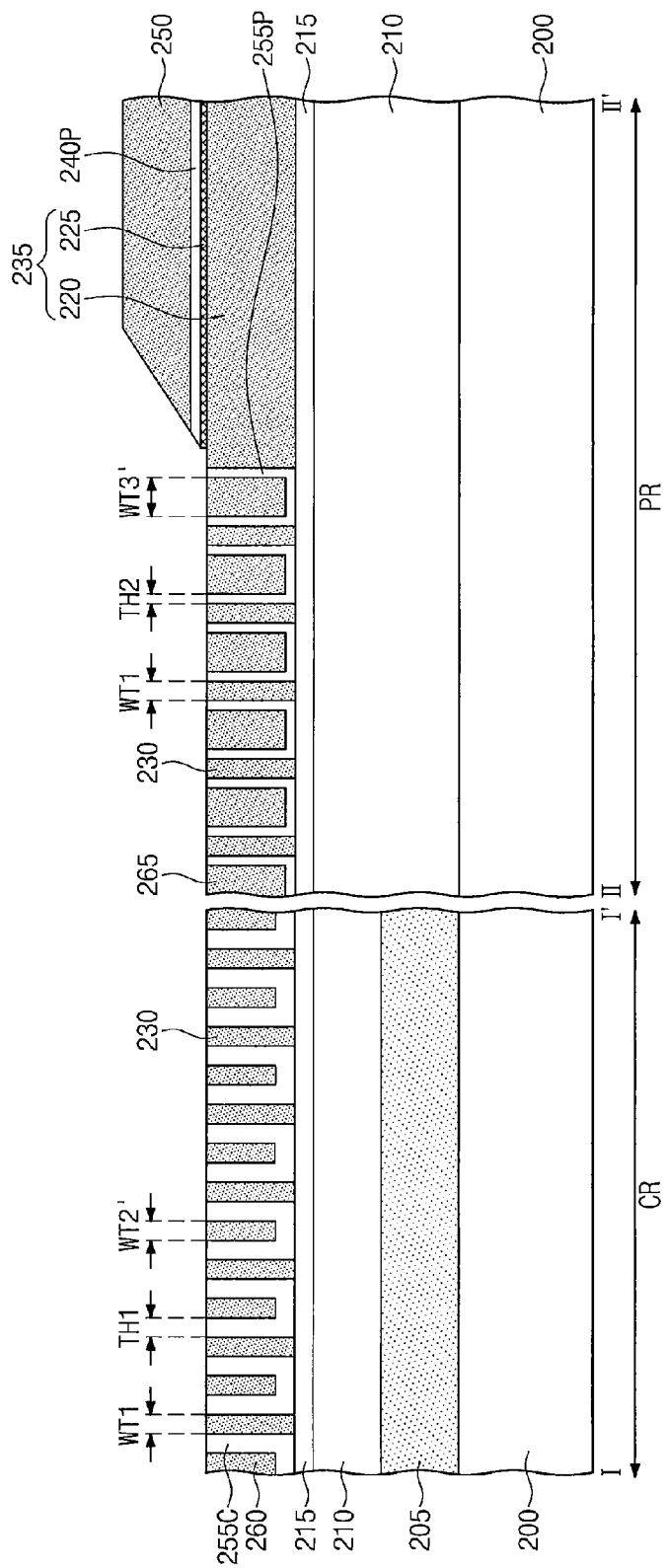

Referring to FIG. 14, an etching process (e.g., a polishing process) may be performed on the third layer 250 to expose top surfaces of the first patterns 230. In some embodiments, the polishing process may be performed using an etch-back process. Here, the polishing stop layer 225 of each of the first patterns 230 may prevent the polishing process from being excessively performed.

As a result of the polishing process, cell spacers 255C and second patterns 260 may be formed on the cell region CR. The cell spacers 255C may be formed between the first patterns 230 to have a "U"-shaped cross-section, and the second patterns 260 may be formed to fill inner spaces of the cell spacers 255 as illustrated in FIG. 14. Each of the second patterns 260 may have a second width WT2'In some embodiments, the second width WT2' may be substantially the same as the first width WT1.

As a result of the polishing process, on the peripheral region PR, peripheral spacers 255P having a "U"-shaped cross-section may be formed between the first patterns 230 extended from the cell region CR, and third patterns 265 may be formed to fill inner spaces of the peripheral spacers 255P, respectively. Each of the third patterns 265 may have a third width WT3'In some embodiments, the third width WT3' may be greater than the first width WT1. Since, as described above, the thickness TH2 of the peripheral spacers 255P may be less than that of the cell spacers 255C, a width of the inner space of each of the peripheral spacers 255P may be greater than a width of the inner space of each of the cell spacers 255C. Accordingly, there may be a difference between the third and first widths WT3' and WT1. Also, the bulk pattern 235 may remain on the peripheral region PR.

As described above, the third layer 250 may be formed to have top surfaces disposed at different levels in the cell region CR and the peripheral region PR. In some embodiments, the first level LV1 of the third layer 250 may be used as a reference level for the polishing process. In this case, the third layer 250 may partially remain on a portion of the peripheral region PR, on which the first patterns 230 are not provided, but may be removed from other portions of the peripheral region PR adjacent to the cell region CR. Accordingly, the second patterns 260, which will be used in a subsequent process, may be formed on the cell region CR.

After the polishing process, the polishing stop layer 225 may be removed. Accordingly, each of the first patterns 230 may be formed of the second layer.

Figure 15:
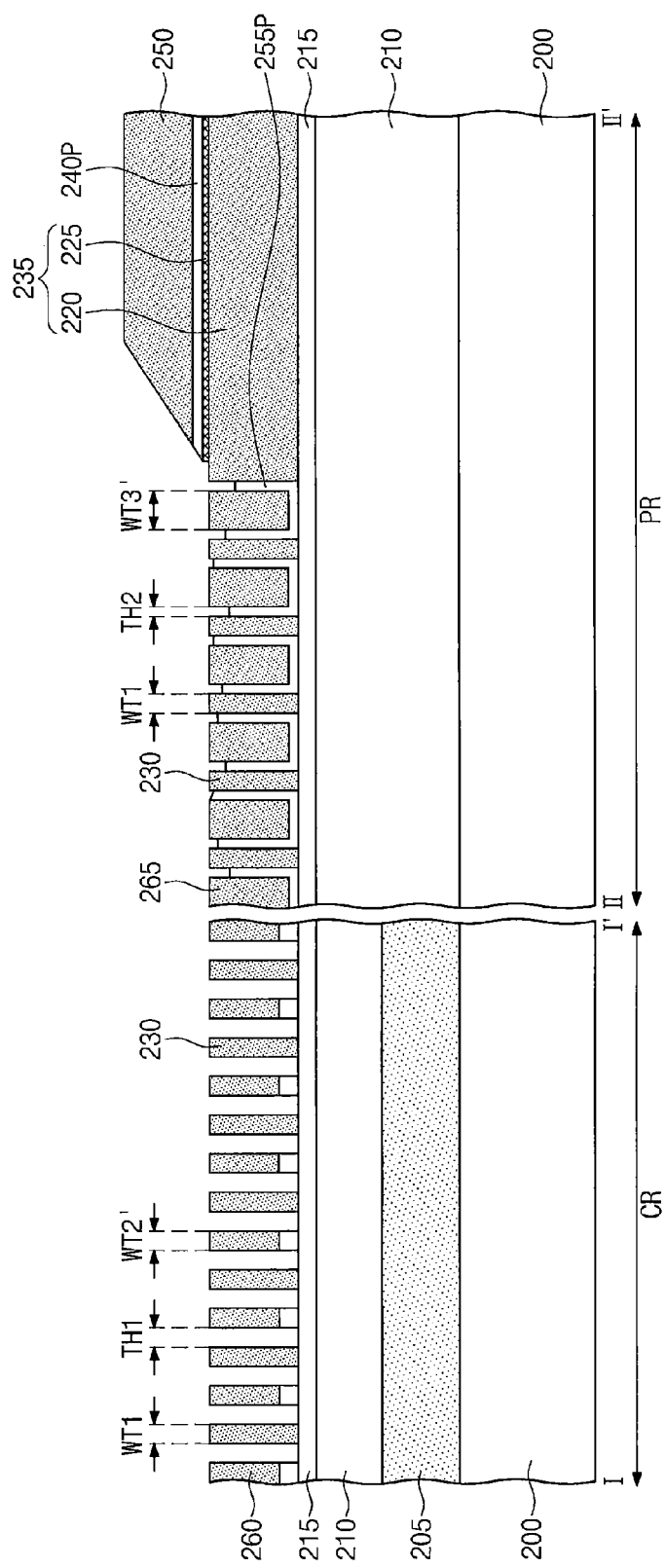

Referring to FIG. 15, the cell spacers 255C and the peripheral spacers 255P may be etched. For example, the cell spacers 255C and the peripheral spacers 255P may be etched by an anisotropic etching process. Since the cell spacers 255C has the first thickness TH1 that is greater than the second thickness TH2 of the peripheral spacers 255P, the peripheral spacers 255P may not be sufficiently etched, while the cell spacers 255C between the first patterns 230 are etched by the etching process as illustrated in FIG. 15. Accordingly, openings may be formed on the cell region CR to expose side surfaces of the first and second patterns 230 and 260 and portions of the etch stop layer 215. However, the etch stop layer 215 on the peripheral region PR may not be exposed, owing to the remaining portions of the peripheral spacers 255P.

In some embodiments, after the etching process, portions of the cell spacers 255C on the cell region CR may remain below the second patterns 260, respectively and the peripheral spacers 255P on the peripheral region PR may remain to cover bottom and side surfaces of the third patterns 265, respectively. As shown in FIG. 15, each of the remaining portions of the peripheral spacers 255P may have a "U"-shaped structure.

Figure 16:
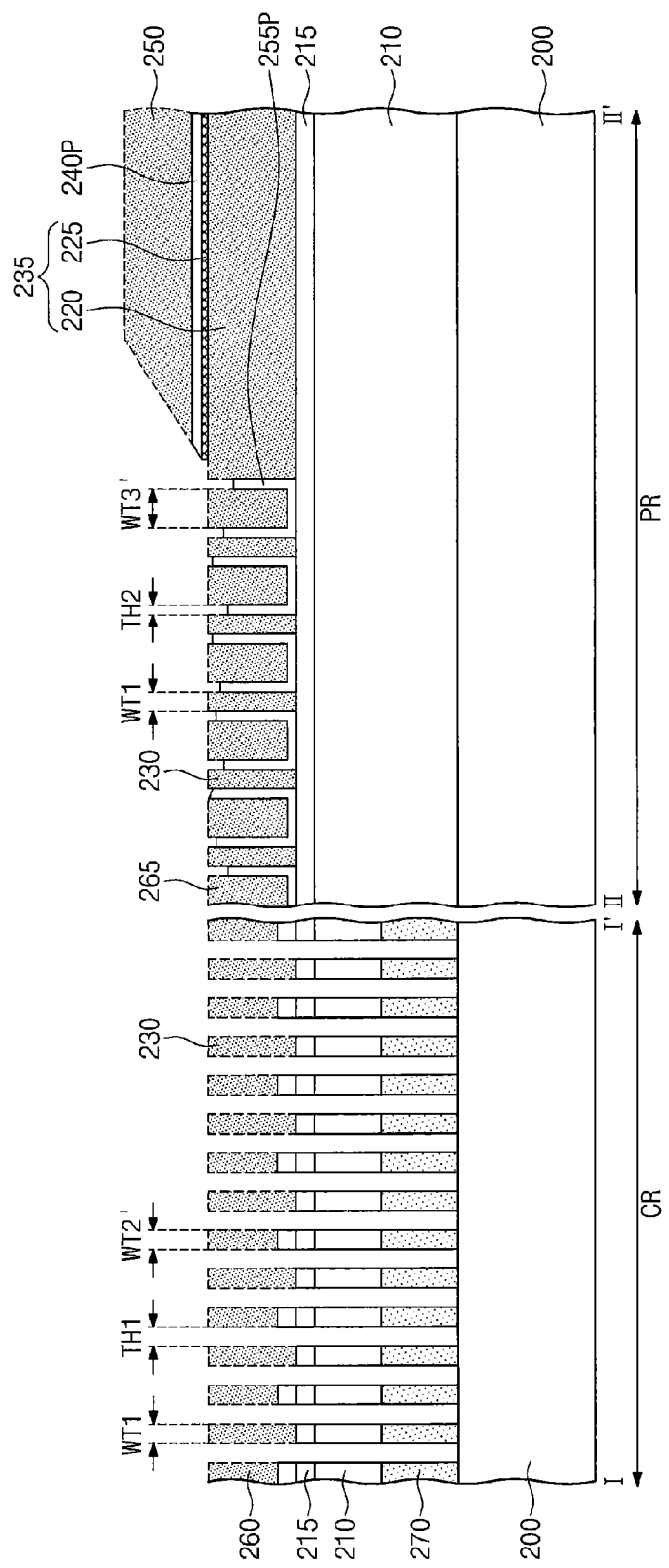

Referring to FIG. 16, the etch stop layer 215, the first layer 210 and the etch target layer 205 may be sequentially etched using the first and second patterns 230 and 260 as an etch mask to form target patterns 270 on the substrate 200.

In some embodiments, the first and second patterns 230 and 260 may be formed of or include substantially the same material as the first layer 210. Accordingly, the first and second patterns 230 and 260 may be etched by a process of etching the first layer 210, for example, after the etching of the etch stop layer 215. Accordingly, it may be possible to omit an additional process for removing the first and second patterns 230 and 260. In some embodiments, the first and second patterns 230 and 260 may remain after forming the target patterns 270, and a process for removing the first and second patterns 230 and 260 may be further performed.

If the etching of the first layer 210 is finished, the etch target layer 205 on the cell region CR may be exposed. In this case, the etch target layer 205 may be etched using the first layer 210 as an etch mask, and as a result, the target patterns 270 may be formed on the cell region CR.

Each of the target patterns 270 may have the first width WT1, and two adjacent ones of the target patterns 270 may be spaced apart from each other by the first width WT1. In some embodiments, the target patterns 270 may be formed to have a line-and-space structure.

The line-and-space patterns, which are formed by methods according to some embodiments of the inventive concepts, may be used to realize various elements in semiconductor devices. For example, the methods may be used to form active patterns, device isolation patterns, word lines, bit lines, interconnection lines, and/or contact plugs. But the inventive concepts may not be limited thereto. For example, the methods according to the inventive concepts may be used to realize a line-and-space structure for any semiconductor device.

According to some embodiments of the inventive concepts, a bulk pattern on a peripheral region may be etched to allow a layer formed on the bulk pattern to have the same top level on cell and peripheral regions. This may make it possible to efficiently and easily perform a subsequent polishing process.

In some embodiments, line patterns on the cell region may be extended from the cell region onto a portion of the peripheral region. Accordingly, when a layer is formed to cover the cell and peripheral regions, the layer formed on the portion of the peripheral region may be formed to have the same top level as the layer formed on the cell region. This may make it possible to efficiently and easily perform a subsequent polishing process, in particular, on the cell region.

While some embodiments of the inventive concepts have been shown and described, it will be understood by one of ordinary skill in the art that variations may be made therein without departing from the spirit and scope of the inventive concepts. The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, comprising:
    forming an etch target layer on a substrate, the substrate comprising a cell region and a peripheral region;
    forming a plurality of first patterns and a preliminary pattern on the etch target layer, the plurality of first patterns being formed on the cell region, each of the plurality of first patterns having a first width, and the preliminary pattern being formed on the peripheral region;
    conformally forming a spacer layer on the plurality of first patterns and the preliminary pattern;
    forming a plurality of first mask patterns on the spacer layer, a first of the plurality of first mask patterns being formed on the cell region and second and third of the plurality of first mask patterns being on the peripheral region and exposing portions of the spacer layer;
    etching the spacer layer and the preliminary pattern on the peripheral region, using the plurality of first mask patterns as an etch mask, to form a plurality of second patterns on the peripheral region;
    forming a first layer on the plurality of first patterns and the plurality of second patterns;
    etching the first layer and the spacer layer, until top surfaces of the plurality of first patterns and the plurality of second patterns are exposed, to form a plurality of third patterns and a plurality of spacers on the cell region; and
    anisotropically etching the plurality of spacers to form a plurality of openings exposing side surfaces of the plurality of first patterns and the plurality of third patterns.

2. The method of claim 1, wherein forming the plurality of first patterns and the preliminary pattern comprises:
    forming an etch stop layer on the etch target layer;
    forming a second layer and a polishing stop layer on the etch stop layer;
    forming a plurality of second mask patterns on the polishing stop layer, first and second of the plurality of second mask patterns being formed on the cell region and exposing portions of the polishing stop layer on the cell region, and a third of the plurality of second mask patterns covering the polishing stop layer on the peripheral region; and
    etching the polishing stop layer and the second layer, using the plurality of second mask patterns as an etch mask, to form the plurality of first patterns and the preliminary pattern.

3. The method of claim 2, wherein the plurality of second mask patterns are spaced apart from each other by a distance that is about three times the first width, and each of the plurality of second mask patterns has a line shape extending in a direction.

4. The method of claim 2, wherein the second layer comprises a material that is etched at an etch rate that is substantially equal to an etch rate of the first layer.

5. The method of claim 2, wherein the second layer comprises substantially the same material as the first layer.

6. The method of claim 1, wherein the plurality of first mask patterns comprise a material that is etched at an etch rate that is substantially equal to an etch rate of the preliminary pattern.

7. The method of claim 6, wherein the plurality of first mask patterns comprises a photoresist and the preliminary pattern comprises a spin on hardmask (SOH) material.

8. The method of claim 1, wherein the plurality of first mask patterns comprises substantially the same material as the preliminary pattern.

9. The method of claim 1, wherein the spacer layer is formed to have a thickness that is substantially equal to the first width.

10. The method of claim 1, wherein each of the plurality of second patterns has a second width that is greater than the first width.

11. The method of claim 1, further comprising etching the etch target layer on the cell region, using the plurality of first patterns and the plurality of third patterns as an etch mask, to form target patterns.

12. A method of fabricating a semiconductor device, comprising:
    forming an etch target layer on a substrate, the substrate comprising a cell region and a peripheral region;

forming a plurality of first patterns on the cell region, each of the plurality of first patterns having a first width and comprising a portion that extends on the peripheral region;

conformally forming a spacer layer that has a first thickness on the plurality of first patterns;

forming a first mask pattern that covers the cell region and exposes the peripheral region;

etching the spacer layer on the peripheral region, using the first mask pattern as an etch mask, to form a peripheral spacer layer that has a second thickness less than the first thickness;

forming a first layer on the spacer layer that is on the cell region and on the peripheral spacer layer;

polishing the first layer, the spacer layer that is on the cell region, and the peripheral spacer layer to expose the plurality of first patterns, to form a plurality of cell spacers and a plurality of second patterns on the cell region and to form a plurality of peripheral spacers on the peripheral region; and anisotropically etching the plurality of cell spacers and the plurality of peripheral spacers.

13. A method of forming a semiconductor device, the method comprising:

forming an underlying layer on a substrate;

forming a plurality of first masks and a plurality of second masks on the underlying layer;

forming a spacer layer along surfaces of the plurality of first masks, the spacer layer defining a plurality of recesses between respective ones of the plurality of first masks;

forming a first mask layer on the plurality of first masks and the plurality of second masks, the first mask layer being formed in the plurality of recesses and being formed in spaces between respective ones of the plurality of second masks, and the first mask layer contacting sides of the plurality of second masks;

forming a plurality of third masks in respective ones of the plurality of recesses, a plurality of fourth masks in respective ones of the spaces, and a plurality of spacers by etching the first mask layer and the spacer layer until upper surfaces of the plurality of first masks and upper surfaces of the plurality of second masks are exposed;

etching the plurality of spacers until the underlying layer is exposed; and etching the underlying layer, after etching the plurality of spacers, using the plurality of first masks, the plurality of second masks, the plurality of third masks and the plurality of fourth masks as an etch mask.

14. The method of claim 13, wherein each of the plurality of first masks and each of the plurality of third masks has a first width, and wherein the spacer layer has a substantially uniform thickness that is substantially equal to the first width.

15. The method of claim 14, wherein each of the plurality of second masks has a second width that is greater than the first width, and wherein the plurality of first masks are spaced apart from each other by a first distance, and the plurality of second masks are spaced apart from each other by a second distance that is greater than the first distance.

16. The method of claim 13, wherein forming the plurality of first masks and the plurality of second masks and forming the spacer layer comprises:

forming a second mask layer on the underlying layer;

forming the plurality of first masks by patterning a first portion of the second mask layer;

forming the spacer layer along the surfaces of the plurality of first masks and an upper surface of a second portion of the second mask layer;

forming a plurality of fifth masks on the spacer layer, a first of the plurality of fifth masks being formed on the plurality of first masks and second and third of the plurality of fifth masks being formed on the second portion of the second mask layer; and forming the plurality of second masks by etching the spacer layer on the upper surface of the second portion of the second mask layer and by etching the second portion of the second mask layer using the second and third of the plurality of fifth masks as an etch mask.

17. The method of claim 16, wherein the second mask layer comprises substantially the same material as the plurality of fifth masks, and wherein the first of the plurality of fifth masks is etched when the second portion of the second mask layer is etched.

18. The method of claim 13, wherein the substrate comprises a cell region and a peripheral region, and wherein the plurality of first masks are formed on the cell region, and the plurality of second masks are formed on the peripheral region.

19. The method of claim 18, wherein a portion of the underlying layer that is formed on the peripheral region is covered by the plurality of second masks and the plurality of fourth masks while etching the underlying layer.

20. The method of claim 13, wherein an uppermost portion of the underlying layer comprises an etch stop layer, and wherein etching the plurality of spacers is performed until the etch stop layer is exposed.

* * * * *